Figure 1:
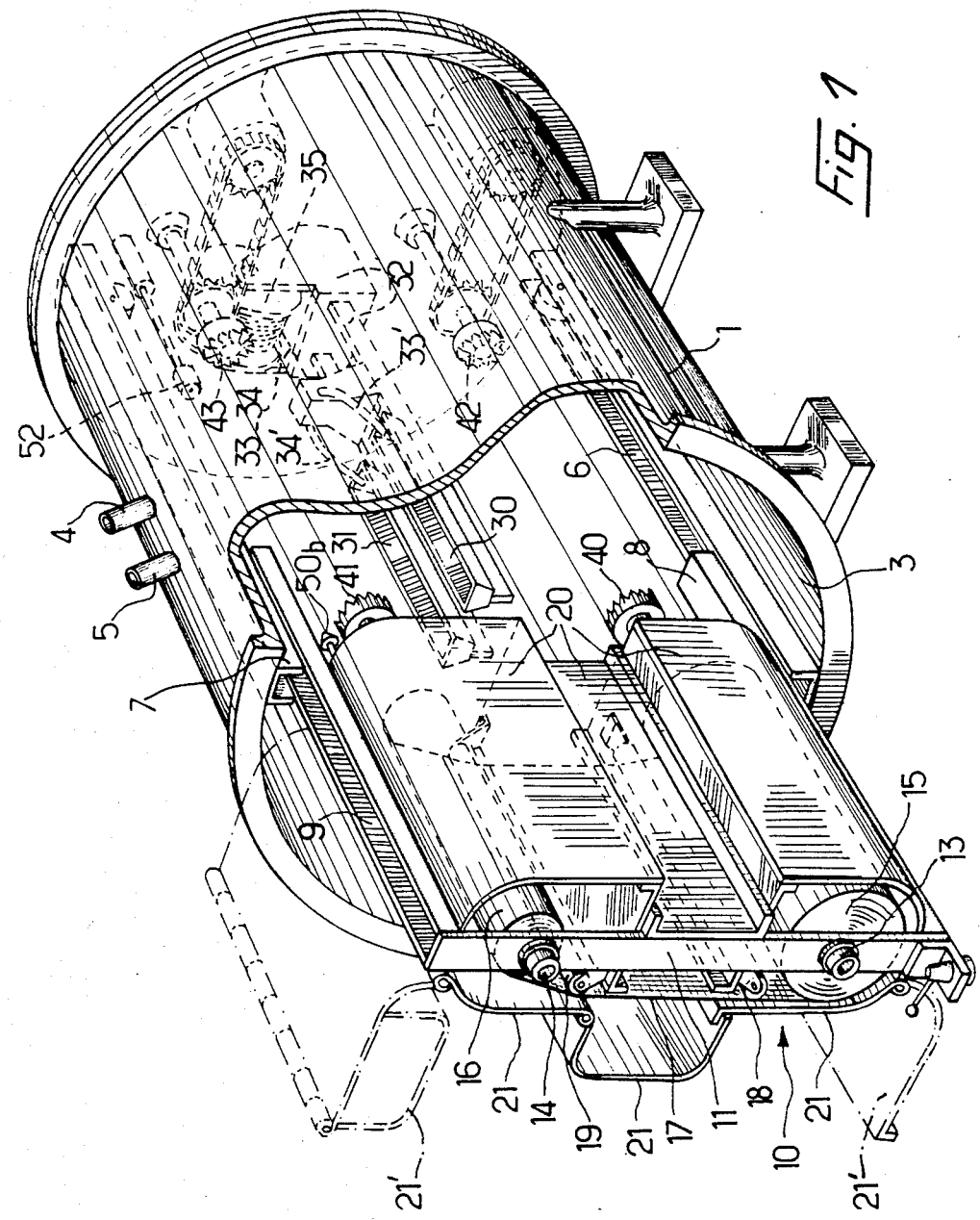

United States Patent [19]

Coffy

[11] Patent Number: 4,532,889
[45] Date of Patent: Aug. 6, 1985

[54] PROCESS AND APPARATUS FOR METALLIC IMPREGNATION OF A WEB OF CONDUCTIVE FIBRES

[75] Inventor: René L. Coffy, Sausset-les-Pins, France

[73] Assignee: Societe Nationale Industrielle Aerospatiale, Paris, France

[21] Appl. No.: 627,713

[22] Filed: Jul. 5, 1984

[30] Foreign Application Priority Data

Jul. 7, 1983 [FR] France ................... 83 11336

[51] Int. Cl.$^3$ ............... C23C 13/08; C23C 13/10
[52] U.S. Cl. .................... 118/718; 118/723; 118/730
[58] Field of Search ............ 118/718, 723, 728, 729, 118/730

[56] References Cited

U.S. PATENT DOCUMENTS

| | | | |
|---|---|---|---|
| 3,449,092 | 6/1969 | Hammond | 118/718 |
| 3,587,728 | 6/1971 | Buhr | |
| 3,693,582 | 9/1972 | Delcour et al. | 118/723 |
| 3,750,623 | 8/1973 | Carpenter et al. | |
| 4,466,258 | 8/1984 | Sando et al. | 118/723 |

FOREIGN PATENT DOCUMENTS

| | | |
|---|---|---|
| 979772 | 12/1950 | France . |
| 2079401 | 12/1973 | France . |
| 2395327 | 12/1977 | France . |
| 55-6427 | 1/1980 | Japan . |

*Primary Examiner*—Richard Bueker
*Attorney, Agent, or Firm*—Armstrong, Nikaido, Marmelstein & Kubovcik

[57] ABSTRACT

The invention relates to a process and an apparatus for the metallic impregnation of a substrate that is in the form of a web of conductive fibres, in which the said substrate is placed in an inert atmosphere that is under partial vacuum (chamber 1), a potential difference is created between the said substrate (cathode) and a metal for impregnation in the said atmosphere, the metal for impregnation is supplied in molten form into the said atmosphere and is maintained at its vaporization temperature by heating.

The invention is of use in the manufacture of semi-finished products for the aeronautical industry.

9 Claims, 6 Drawing Figures

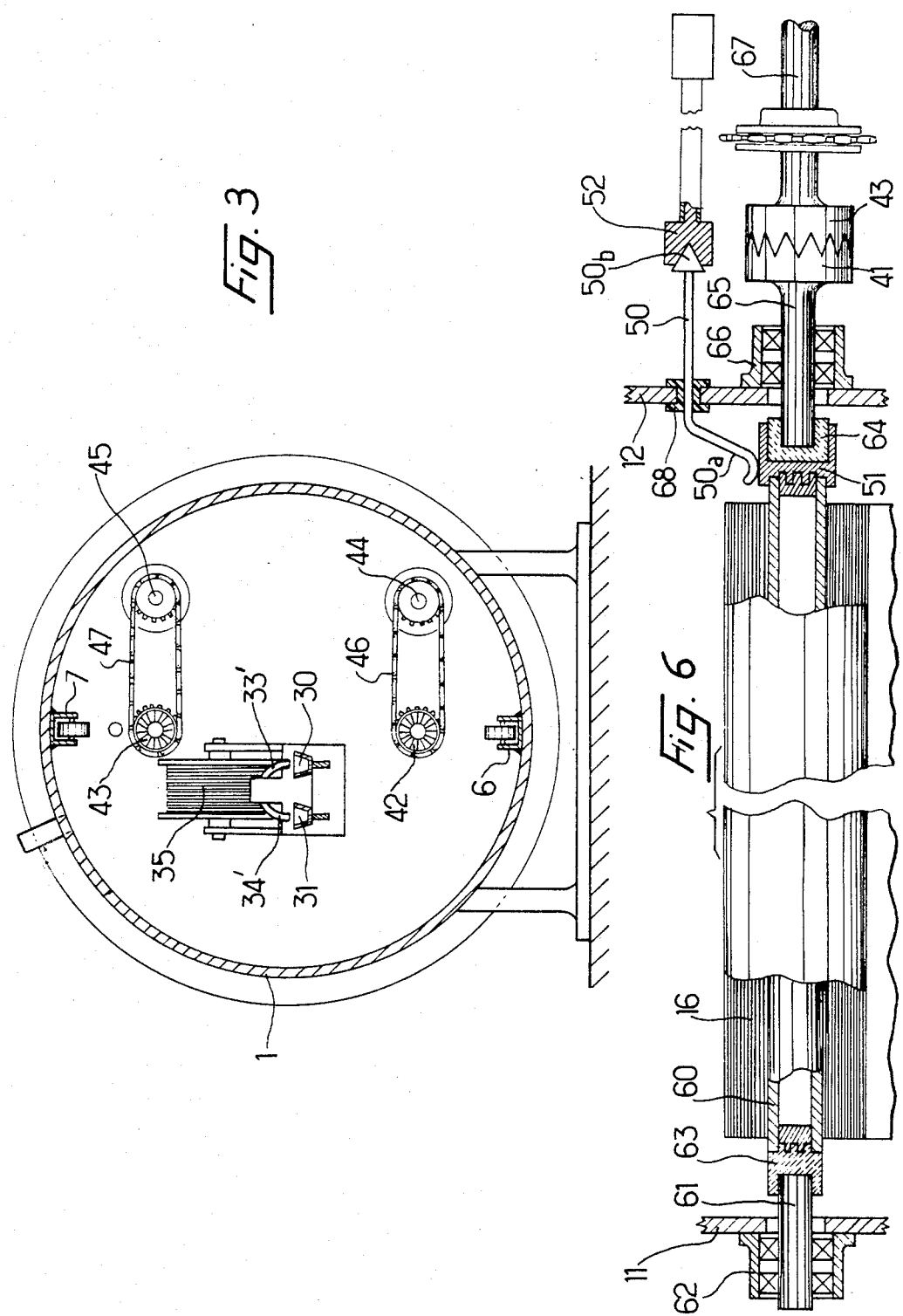

PROCESS AND APPARATUS FOR METALLIC IMPREGNATION OF A WEB OF CONDUCTIVE FIBRES

The present invention relates to a process and an apparatus for impregnating with metal a product that is in the form of a web of electrically conductive, woven or non-woven fibres, of, for example, graphite, boron or silicon carbide.

In fact, there is a need especially in the aeronautical industry for very strong, light-weight materials.

There are used at present, especially in the aeronautical industry, composite materials generally comprising synthetic fibres that have high or very high mechanical performance, such as glass fibres, carbon fibres, or the like, and are agglomerated in a heat-polymerised synthetic resin matrix. It is possible with these composite materials to manufacture, in a satisfactory manner with regard to strength and light weight, a wide variety of articles that are resistant to high static and/or dynamic stresses.

Taking into account the actual characteristics of the synthetic resin used and, especially, its limited resistance to temperature and ageing, it is not possible, in practice, to use these laminated materials when the ambient temperature exceeds 100° C.

Furthermore, the characteristics of mechanical strength of the resin, especially the shear strength, are relatively poor and limit the overall strength of the articles made from composite materials manufactured in this manner.

To overcome these disadvantages, attempts have been made to replace the synthetic resin matrix by a light metal, especially aluminium, the ability to withstand temperature and the mechanical strength of which are considerably better than those of the synthetic resins.

Thus it was that a new technology was created for improving materials by binding very strong fibres with a metal. At present, this association is generally brought about by immersing the fibres in a bath of molten metal; this immersion is preceded by numerous treatments of the fibres on the one hand to avoid their deterioration owing to oxidation and, on the other hand, to promote the penetration of the metal into all the pores of the substrate and its adhesion to the fibres.

The aim of the present invention is to bring about this impregnation by means of a process and using an apparatus which make it possible to dispense with the preparation stages, which are often time-consuming and expensive, while maintaining, even increasing, the quality of the final semi-finished product. According to the invention, this aim is achieved by means of a single operation and a single apparatus, the manufacturing equipment thus being greatly simplified. As a result, it is possible to avoid the expensive burden of the known techniques of maintaining one or more bath(s) containing large quantities of molten metal and salts.

More precisely, the invention relates to a process for the metallic impregnation of a substrate that is in the form of a web of conductive fibres, according to which process the said substrate is placed in an inert atmosphere under partial vacuum, a potential difference is created between the said substrate as cathode and a metal for impregnation placed in the said atmosphere, the metal for impregnation is supplied in molten form into the said atmosphere and is maintained at its vaporisation temperature by heating.

In a preferred manner, the said substrate is wound off in the above-mentioned atmosphere adjacent the molten metal by unwinding and rewinding the web at a rate that can be adjusted as a function of the characteristics of the impregnation to be obtained.

The invention relates also to an apparatus for implementing the above-mentioned process which comprises:

a chamber which is provided with means for closing it so that is is airtight and into which there run a duct for evacuating the chamber and a pipe supplying an inert gas to it, a device for supporting the substrate comprising a carriage that can move between a first position inside the chamber and a second position outside the chamber through an aperture closed by the above-mentioned closing means, and comprising means for guiding the carriage with respect to the chamber when it moves from one of the positions towards the other, the said carriage being provided with means for rotatably accommodating a reel of web to be unwound and a reel for winding this web, the reels being spaced one from the other, and means for guiding the said web extending between the reels in a running plane which is fixed with respect to the carriage and is substantially parallel to the line of its displacement, at least one crucible for receiving the molten metal, which crucible is mounted on the said chamber inside the latter and is located substantially parallel to and adjacent the running plane of the web when the carriage is in its first position, means for the electrical insulation of the said reels with respect to the said carriage, and electrical contact means enabling the said reels to be connected to a source of potential when the carriage is in its above-mentioned first position.

In a preferred embodiment, the said apparatus comprises two crucibles arranged one each side of the above-mentioned plane.

Furthermore, the carriage designed to accommodate the said reels rotatably has a device for connecting them to at least one driving shaft located inside the said chamber.

The said connecting device may be coupled to the said shaft when the carriage is in its first position and uncoupled from this shaft when the carriage is in any other position.

Advantageously the carriage also has means for containing a volume inside the chamber, the means comprising lateral screens which are arranged adjacent the portion of the web located in the running plane and which delimit a space on each side of this plane in which the crucible, or each of the crucibles, is located when the carriage is in its first position.

At least one part of the screens may be hinged to the said carriage to allow lateral access to the latter in its second position when the reels are being loaded or unloaded.

Finally, an apparatus according to the invention may have a device for feeding the above-mentioned crucible or each of the above-mentioned crucibles with a metallic filament, which device is fixed to the walls of the said chamber, inside the latter.

The invention will be understood more readily from the description below which is given purely as a non-limiting example and which makes clear the advantages and secondary characteristics of the invention.

Figure 2:
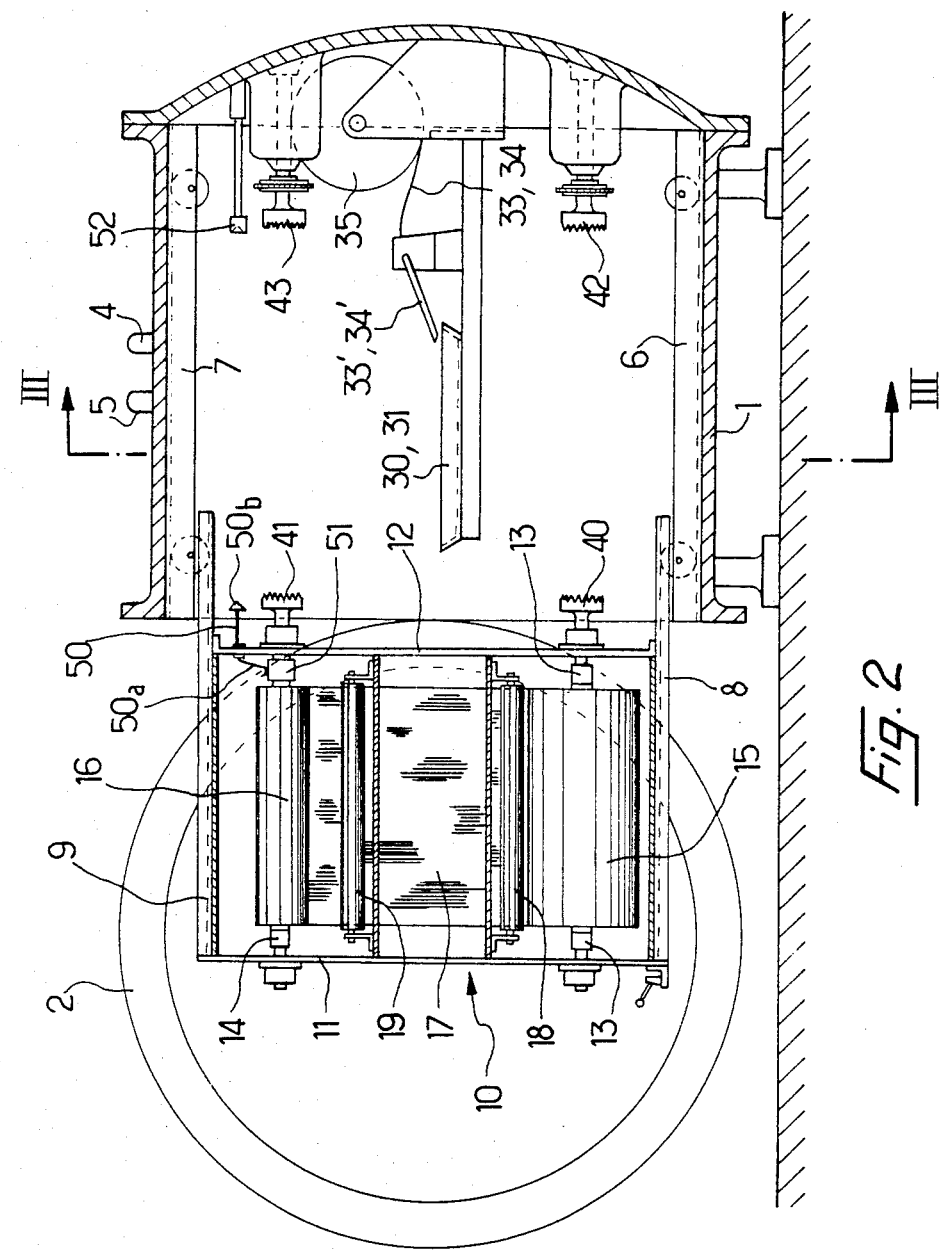
Figure 5:
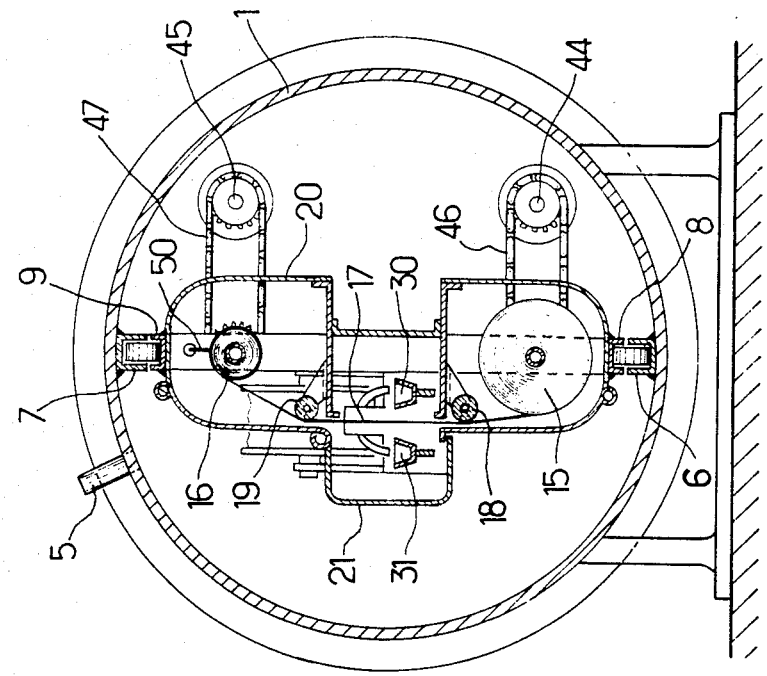
Figure 4:
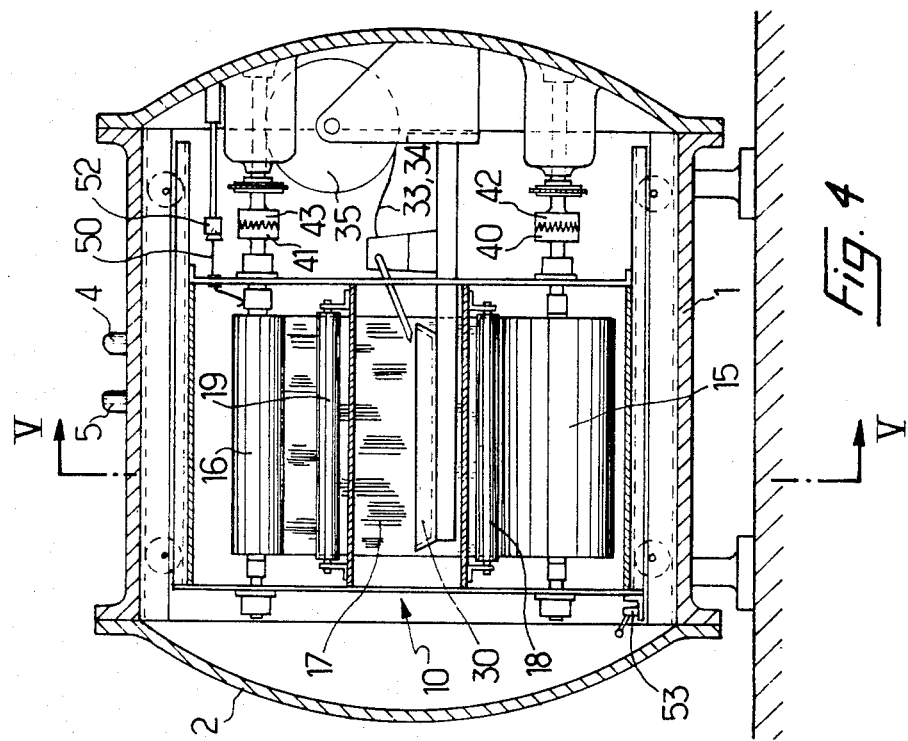

Reference will be made to the attached drawings in which:

FIG. 1 is a partially cut away external view of the apparatus for implementing the process according to the invention, FIG. 2 is a cross-section of the apparatus of FIG. 1, the carriage being in its second position, FIG. 3 is a cross-section along the line III—III of FIG. 2, FIG. 4 is a cross-section of the apparatus of FIG. 1, the carriage being in its first position, FIG. 5 is a cross-section along the line V—V of FIG. 4, and FIG. 6 is a detailed view showing the mechanical coupling and the electrical connection of the winding members of the carriage when the latter is in its first position.

FIGS. 1 and 2 show apparatus for implementing a process according to the invention. This apparatus comprises a generally cylindrical chamber 1, at least one of the ends 2 of which is openable and forms an airtight door closing an opening 3 giving access to the inside of the chamber. This chamber is provided with a first duct 4 for evacuating it (by means of a device which is not shown) and a second duct 5 which forms a pipe for supplying an inert gas to it.

The lower portion and the upper portion of the chamber are provided with guide rails 6 and 7, respectively, that are capable of slidably accommodating corresponding guide elements 8 and 9 of a carriage 10. This carriage can therefore be housed in the chamber (first position) or removed from the chamber (second position as shown) by displacement along the axis of the chamber 1 by means of these guide elements which also ensure that in its second position the projecting carriage is maintained in a stable position. The representation of the guide means is to be understood as indicating a general principle, it being possible for the guide means to be in the form of numerous variants known per se.

As for the carriage 10, it is formed principally by two end supports 11 and 12 which are arranged between the guide rails and are provided with lower means 13 and upper means 14 for rotatably accommodating in a manner permitting rapid removal two cylinders forming the cores of two reels 15 and 16 for winding and unwinding the substrate 17 which is in the form of a web of conductive filaments or fibres. It is thus possible to mount on the carriage a full reel 15 by means of the coupling members 13 and an empty reel at the level of the members 14 for winding the substrate that is unwound from the reel 15. Between the two reels, the web 17 follows an approximately vertical path defined by adjustable tension rollers 18 and 19 supported by the said carriage. The position of the web 17 located between the two rollers 18 and 19 is thus maintained in a vertical plane that is slightly off-set laterally with respect to the framework of the carriage 10 so that adequate space is provided between this framework and the plane of the web. In addition, the carriage comprises a lateral cowling system for the winding, running and unwinding zones of the web which is formed by an arrangement of plates 20 which are fixed with respect to the framework of the carriage and are located on one side of the latter and by an arrangement of movable shutters 21 which are hinged one to another and which, in a first position, are substantially symmetrical with the arrangement of plates 20 with respect to the framework of the carriage and, in a second position (21' in FIG. 1), are folded about their hinges to allow unimpeded lateral access to the said carriage for, especially, loading and unloading the reels and cylinders. It will be noted on FIG. 1 that the central shutter adjacent the portion of the web 17 located between the two rollers 18 and 19 defines with this portion a space that projects with respect to the cowling of the reels 15 and 16; the role of this projecting space will be explained below. An approximately similar space is formed between the other face of the web and the central portion of the cowling 20.

Two crucibles 30, 31 are arranged inside the chamber 1 parallel to its longitudinal axis. These crucibles are maintained rigidly in position by means of a bracket 32 that is fixed to the non-opening end of the chamber. There is not shown on these Figures a means for resistance heating of the said crucibles having sufficient power to maintain in molten state and at a temperature that is at least equal to its vaporisation temperature a given metal placed in these crucibles. This metal is preferably fed to each of the crucibles in the form of a filament 33, 34 which is supplied from a storage reel 35, integral with the bracket 32, by means of an unwinding device (not shown) and is guided towards each of the crucibles by means of tubular members 33', 34'.

It should also be noted that the position of the crucibles 30, 31 in the chamber is such that the vertical plane of the web between the two tension rollers passes between the two crucibles when the carriage 10 is in its above-mentioned first position (see FIG. 5). In addition, the height of the crucibles 30, 31 with respect to the lower portion of the chamber is such that the crucibles are located inside the spaces defined on each side of the vertical portion of the web 17 by the central portions of the cowlings 20 and 21 (see also FIG. 5).

It will also be noted on FIGS. 1 and 2 that the means 13 and 14 for supporting the cylinders for winding and unwinding the web on the carriage 10 have, on the side of the carriage facing the inside of the chamber, a coupling member 40, 41 that is capable of co-operating with a corresponding member 42, 43, provided at the closed internal end of the chamber, when the carriage 10 is in its position inside the chamber 1. These devices 40 to 43 permit automatic coupling and uncoupling of the cylinders carrying the web with driving members that rotate the cylinders for winding and unwinding the web.

In addition to some of the elements already described and having the same reference numerals, FIG. 3 shows the connection between the coupling devices 42 and 43 and the driving shafts 44 and 45 by means of chains 46, 47.

Returning finally to FIGS. 1 and 2, the carriage is provided with an electrical connection element 50 formed by a conductor, one end 50a of which ensures a rubbing contact with a ring 51 of the cylinder of the reel 16 and the other end 50b of which projects horizontally beyond the framework mounting 12 of the carriage 10. The end 50b forms a plug which, when the carriage is in its first position, connects the conductor 50 with a stationary socket 52 that is secured to the chamber. The conductor 50 and the socket 52 are electrically insulated from the carriage 10 and the chamber 1, respectively.

FIGS. 4 and 5 show the apparatus in its active position, that is to say during impregnation of the substrate. The majority of the elements already described will be found on these Figures and have the same reference numerals, the door 2 of the chamber being closed, the members 40, 42 and 41, 43 being coupled and the plug 50b being electrically connected to the socket 52. One of the crucibles 30, 31 is located on each side of the vertical plane of the run of the web 17, as previously described. Finally, 53 represents schematically a device for locking the carriage in its first position.

FIG. 6 shows in detail the support of a cylinder for winding the web (in this case at the level of the reel 16) by the carriage 10 when the carriage is in its first position and means for electrical insulation of the cylinder. The reel 16 is thus wound on a metallic cylinder 60. This cylinder is coupled to the bearing journal 61 of a bearing 62 arranged on the mounting 11 of the carriage by means of a part 63 in the form of a ring or sleeve that is made of insulating material and is fixed to the cylinder 60. On the side of the mounting 12, the cylinder is in contact with the metallic slip ring 51 and, therefore, in electrical connection with the ring which has, in the same way as at its other end, an insulating sleeve which co-operates with the end 65 of a shaft passing through the mounting 12 into a bearing 66.

A device for moving the free bearing journal 61 away from the shaft 65 is provided to permit the removal or replacement of the cylinder between their ends. The rotary connection between the shaft 65 and the cylinder 60 can be formed by a dog clutch between the ring 51 and the cylinder 60, the ring being, for example, fixed to the said shaft.

At its other end, the shaft 65 is provided with an automatic coupling member 41 which co-operates with a similar member 43 arranged on a driving shaft 67. The same devices are provided for the cylinder of the lower reel 15 with the exception of the slip ring 51. FIG. 6 also shows the conductor 50 arranged on the mounting 12 by means of an insulating ring 68 and the female socket 52.

The operation of the apparatus for implementing the process of metallic impregnation is described below.

With the carriage 10 in the position shown in FIGS. 1 and 2 and with the shutters 21 raised, the reel 15 formed by winding a web of woven or non-woven, long or short, conductive fibres is put into position and the free end of the web is wound around the cylinder 60 over the tension rollers 18 and 19.

The carriage is then slid into the chamber 1 and the end 2 is re-closed. By means of the duct 4, a partial vacuum of the order of $10^{-2}$ Pa is created in the chamber and then an inert gas is introduced into the chamber via the pipe 5 until a pressure of approximately 1Pa is produced. A potential difference of the order of from 1500 to 2000V is then established between the crucibles 30, 31 and the substrate by means of the conductor 50. The intense electrical field thus formed produces a plasma of the rarefied gas in the chamber, one of the effects of which is to etch the substrate by ionic bombardment of the substrate. A first unwinding of the web between the reel 15 and the reel 16 can be carried out solely for cleaning and preparation by actuating the rotation of the cylinders of the reels by means of the driving shafts, such as 67.

The crucibles 30, 31 are then supplied with metal by unwinding from the reel 35 and this metal is brought to its vaporisation temperature by heating the crucibles. The potential difference is then set between 500 and 1500V. The atoms of vaporised metal are partially ionised in the rarefied gas plasma and the positive ions so formed are accelerated and attracted by the substrate, which is the negative electrode of the arrangement. Owing to the intense electrical field formed around the substrate, it dominates the other factors affecting the movement of the metal particles, thus ensuring a uniform covering of the substrate. It will be noted in this context that the cowlings 20, 21, which are earthed, form a means for containing the zone of electrified atmosphere about the substrate 17. The loss of metal by evaporation is compensated by the automatic feeding of the crucibles with metallic filament and the substrate is drawn between the two crucibles by means of the members for driving the reel cylinders. The ions of rarefied gas and the evaporated metallic ions release their energy in the form of heat on contact with the surface of the substrate which they heat, thus promoting the adhesion of the metal to the support.

Furthermore, by altering the rate of unwinding of the web it is possible to vary the degree of impregnation as desired.

After impregnation, the carriage 10 is removed thus disconnecting it from the voltage source, and the finished product is unloaded to be replaced by a product to be impregnated. It will be noted that with a suitable air lock at the opening 3 it would be possible during loading operations to preserve at least part of the vacuum formed in the chamber 1.

One of the advantages of the process according to the invention is that the bombardment of the substrate by the positive ions of the rarefied gas forms an excellent means of cleaning the surface of the substrate which is a factor in improving the adhesion of the metal to be deposited without, however, degrading the substrate. In this manner, all the preceding treatments which are normally used in the known impregnation processes can be dispensed with. In addition, the heat released at the surface of the substrate by the energy of the metallic and gaseous ions is also a factor in improving the adhesion of the metal deposited.

The product obtained by this process has a very precisely determined coating or impregnation and is thus suitable for numerous uses as semi-finished product for the industrial production of strong, light-weight aeronautical articles. The fibres used can be made of carbon, boron or any other conductive material. The metallic matrix can be aluminium or cadmium.

The invention can be used advantageously in the field of manufacturing semi-finished products for the aeronautical industry.

I claim:

1. An apparatus for implementing a process for the metallic impregnation of a substrate that is in the form of a web of conductive fibers, characterised in that it comprises:

a chamber which is provided with means for closing it so that it is airtight and into which there run a duct for evacuating the chamber and a pipe supplying an inert gas to it, a device for supporting the substrate comprising a carriage that can move between a first position inside the chamber and a second position outside the chamber through an aperture closed by the closing means, and comprising means for guiding the carriage with respect to the chamber when it moves from one of the positions towards the other, the said carriage being provided with means for rotatably accommodating a reel of web to be unwound and a reel for rewinding this web, the reels being spaced one from the other, and means for guiding the said web extending between the reels in a running plane which is fixed with respect to the carriage and is substantially parallel to the line of its displacement, at least one crucible for receiving the molten metal, which crucible is mounted on the said chamber and inside it and is located substantially parallel to and adjacent the running plane of the web when the carriage is in its first position, means for the electrical insulation of the said reels with respect to the said carriage, and electrical contact means enabling the said reels to be connected to a source of potential when the carriage is in its first position.

2. An apparatus according to claim 1, characterised in that it comprises two crucibles arranged one on each side of the running plane of the web.

3. An apparatus according to claim 1, characterised in that the means on the carriage for rotably accommodating the said reels have a device for connecting them to at least one driving shaft located inside the said chamber.

4. An apparatus according to claim 3, characterised in that the said connecting device is coupled to the said driving shaft when the carriage is in its first position and is uncoupled from this shaft when the carriage is in any other position.

5. An apparatus according to claim 2 characterised in that the carriage has means for enclosing a volume inside the chamber, the means comprising lateral screens which are arranged adjacent the portion of the web located in the running plane and which delimit a space on each side of this plane in which the crucibles are respectively located when the carriage is in its first position.

6. An apparatus according to claim 5, characterised in that at least one part of the screens is hinged to the said carriage to allow lateral access to it in its second position when the reels are being loaded or unloaded.

7. An apparatus according to claim 1 characterised in that it comprises a device for feeding each crucible with metal in the form of a filament, which feed device is fixed to the walls of the said chamber and inside it.

8. An apparatus according to claim 6 characterised in that it comprises a device for feeding each crucible with metal in the form of a filament, which feed device is fixed to the walls of the said chamber and inside it.

9. An apparatus according to claim 6 characterised in that the means on the carriage for rotatably accommodating the said reels have a device for connecting them to at least one driving shaft located inside the chamber, the connecting device being such that the driving shaft is coupled to the reels when the carriage is in its first position and is uncoupled from the reels when the carriage is in any other position.

* * * * *